(12) United States Patent
Samueli et al.

(10) Patent No.: US 7,515,630 B2
(45) Date of Patent: Apr. 7, 2009

(54) SYSTEM FOR, AND METHOD OF, PROCESSING QUADRATURE AMPLITUDE MODULATED SIGNALS

(75) Inventors: Henry Samueli, Northridge, CA (US); Charles P. Reames, Lakewood, CA (US)

(73) Assignee: Broadcom Corporation, Irvine, CA (US)

( * ) Notice: Subject to any disclaimer, the term of this patent is extended or adjusted under 35 U.S.C. 154(b) by 188 days.

(21) Appl. No.: 11/364,518

(22) Filed: Feb. 27, 2006

(65) Prior Publication Data

US 2006/0146927 A1 Jul. 6, 2006

Related U.S. Application Data

(63) Continuation of application No. 09/819,049, filed on Jan. 20, 1998, now Pat. No. 7,042,939, which is a continuation of application No. 08/285,504, filed on Aug. 3, 1994, now Pat. No. 5,754,591.

(51) Int. Cl.
*H03K 5/159* (2006.01)
*H04L 5/12* (2006.01)

(52) U.S. Cl. .................... 375/233; 375/261; 375/350

(58) Field of Classification Search ................. 375/232, 375/257, 261, 350, 371, 233–236; 329/304, 329/307
See application file for complete search history.

(56) References Cited

U.S. PATENT DOCUMENTS 3,962,637 A   6/1976 Motley et al.

(Continued)

OTHER PUBLICATIONS

Daneshrad, et al., "A Carrier and Timing Recovery Technique for QAM Transmission on Digital Subscriber Loops", IEEE ICC '93 (Geneva, Switzerland), pp. 1804-1808, May 1993.

(Continued)

*Primary Examiner*—Don N Vo
(74) *Attorney, Agent, or Firm*—Sterne, Kessler, Goldstein & Fox P.L.L.C.

(57) ABSTRACT

Analog signals encoded with quadrature amplitude modulation (QAM) pass through a coaxial cable at a particular baud rate. These signals have a carrier frequency individual to the TV station being received. They are mixed with signals from a variable frequency oscillator to produce signals at a particular intermediate frequency (IF). An analog-digital converter (ADC) converts the IF signals to corresponding digital signals which are demodulated to produce two digital signals having a quadrature phase relationship. After being filtered and derotated, the digital signals pass to a symmetrical equalizer including a feed forward equalizer (FFE) and a decision feedback equalizer (DFE) connected to the FFE in a feedback relationship. The DFE may include a slicer providing amplitude approximations of increasing sensitivity at progressive times. Additional slicers in the equalizer combine the FFE and DFE outputs to provide the output data without any of the coaxial cable noise or distortions. The equalizer outputs and initially the derotation outputs, and the slicer outputs, servo (1) the oscillator frequency to obtain the IF frequency, (2) the ADC sampling clock to obtain the digital conversion at a rate related to the particular baud rate and (3) the derotator. The servos may have (1) first constants initially after a change in the station selection and (2) second time constants thereafter. The ADC gain is also servoed (1) initially in every ADC conversion and (2) subsequently in every nth ADC conversion where n=integer>1. The above recover the QAM data without any of the coaxial cable noise or distortions.

15 Claims, 5 Drawing Sheets

U.S. PATENT DOCUMENTS

| | | | |
|---|---|---|---|
| 4,227,152 A | | 10/1980 | Godard et al. |
| 4,253,184 A | * | 2/1981 | Gitlin et al. .................. 375/232 |
| 4,599,732 A | * | 7/1986 | LeFever .................... 375/346 |
| 5,163,044 A | * | 11/1992 | Golden ....................... 370/286 |
| 5,386,239 A | * | 1/1995 | Wang et al. .................. 348/472 |
| 5,400,366 A | * | 3/1995 | Iwamatsu ................... 375/344 |
| 5,412,352 A | | 5/1995 | Graham |
| 5,471,508 A | * | 11/1995 | Koslov ....................... 375/344 |
| 5,692,011 A | | 11/1997 | Nobakht et al. |
| 5,754,591 A | | 5/1998 | Samueli et al. |
| RE38,876 E | * | 11/2005 | Samueli et al. ............. 375/235 |
| 7,042,939 B1 | | 5/2006 | Samueli et al. |

OTHER PUBLICATIONS

Joshi, et al., "A VLSI Architecture for a Single-Chip 5-MBAUD QAM Receiver", IEEE Global Telecommunications Conference (Orlando, FL), pp. 1265-1268, Dec. 1992.

Lu, et al., "A 60-Mbaud Adaptive Transversal Equalizer in 1.0-.mu.m CMOS for QAM Digital Modems", Proceedings of the IEEE 1993 Custom Integrated Circuits Conference, May 1993.

Lu, et al., "A 60-Mbd, 480-Mb/s, 256-QAM Decision-Feedback Equalizer in 1.2-μm CMOS", IEEE Journal of Solid-State Circuits, vol. 28, No. 3, pp. 330-338, Mar. 1993.

Samueli, et al., "A VLSI Architecture for a High-Speed All-Digital Quadrature Modulator and Demodulator for Digital Radio Applications", IEEE Journal on Selected Areas in Communications, vol. 8, No. 8, pp. 1512-1519, Oct. 1990.

Samueli, et al., "VLSI Architectures for a High-Speed Tunable Digital Modulator/Demodulator/Bandpass-Filter Chip Set", 0-7803-0593-0/92 IEEE, pp. 1065-1068, 1992.

Samueli, et al., "VLSI Architectures and Circuits for High Bit-Rate Digital Modems, Adaptive Equalizers and Frequency Synthesizers", 1992 IEEE Architectures and Circuits, pp. 211-220, Mar. 1992.

Wong, et al., "A 200-MHz All-Digital QAM Modulator and Demodulator in 1.2-μm CMOS for Digital Radio Applications", IEEE Journal of Solid State Circuits, vol. 26, No. 12, pp. 1970-1980, Dec. 1991.

* cited by examiner

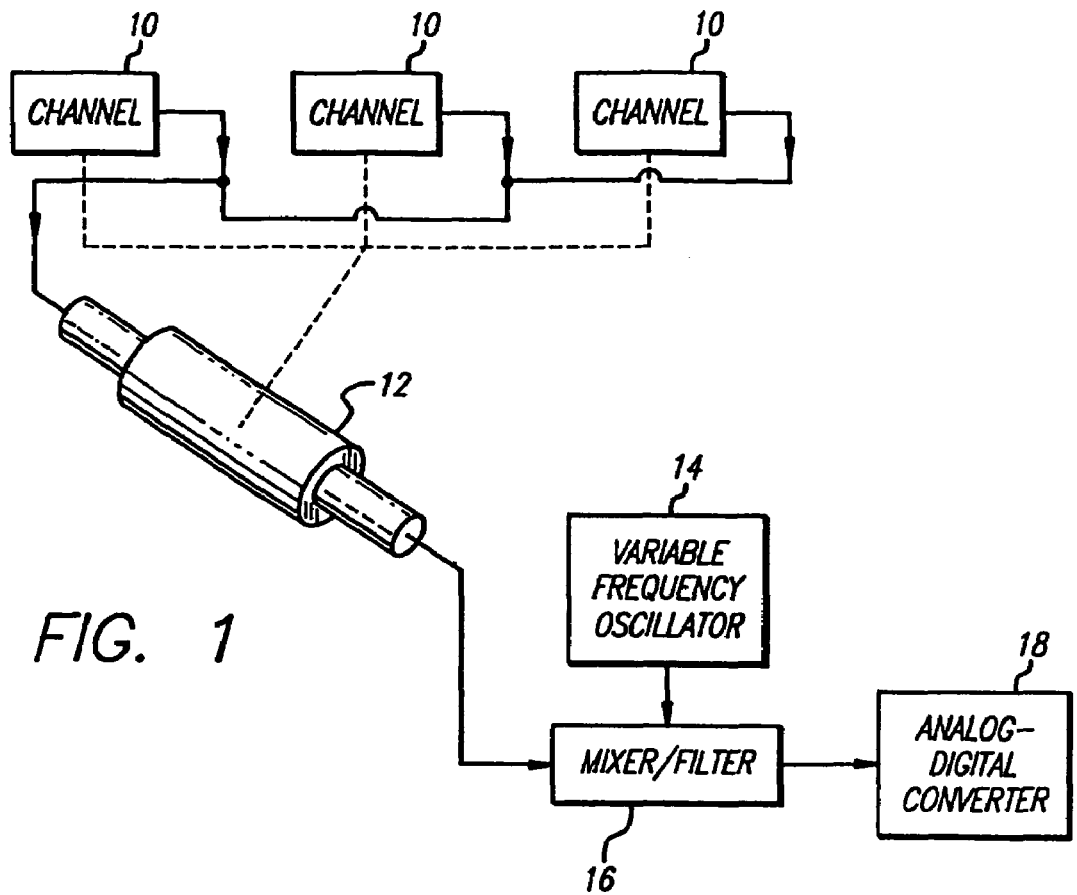
FIG. 1
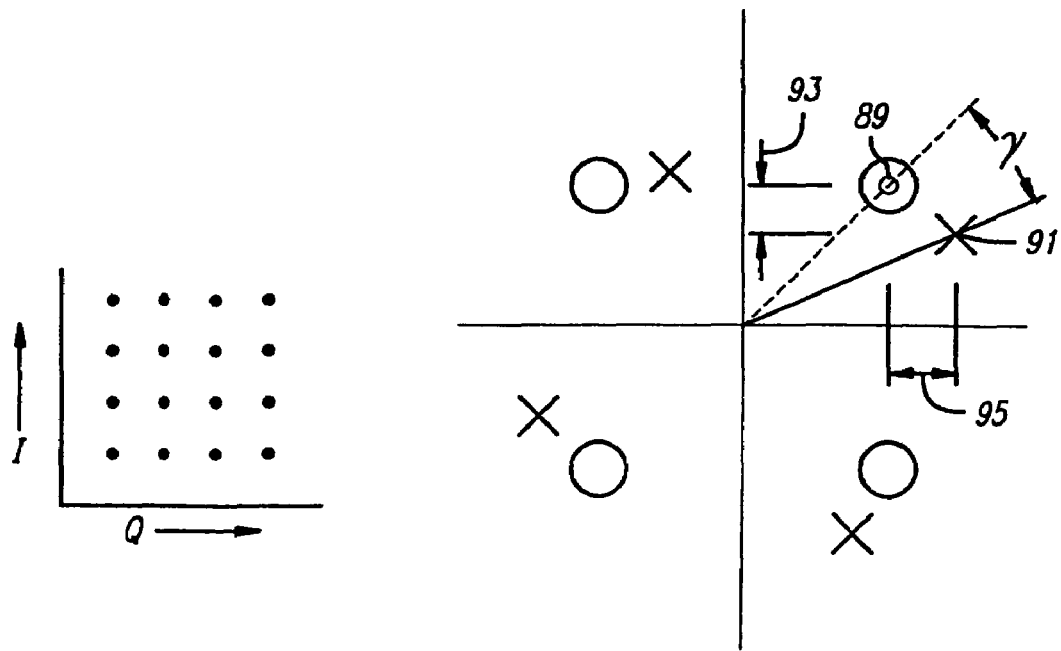
FIG. 4
FIG. 7

SYSTEM FOR, AND METHOD OF, PROCESSING QUADRATURE AMPLITUDE MODULATED SIGNALS

This application is a continuation of U.S. patent application Ser. No. 09/819,049 filed Jan. 20, 1998, now U.S. Pat. No. 7,042,939, which is a continuation of U.S. patent application Ser. No. 08/285,504 filed Aug. 3, 1994, now U.S. Pat. No. 5,754,591, the entire contents of which are incorporated herein by reference.

This invention relates to systems for, and methods of, recovering digitally modulated television signals from the noise and distortion in coaxial cables. More particularly, this invention relates to systems for, and methods of, recovering quadrature amplitude modulated signals from the noise and distortion in coaxial cables. In these systems and methods, quadrature amplitude modulation is used to transmit the television information. The systems and methods of this invention use digital techniques to recover the quadrature amplitude modulated signals from the noise and distortion in the coaxial cables.

Modern digital telecommunication systems are operating at ever-increasing data rates to accommodate society's growing demands for information exchange. However, increasing the data rates, while at the same time accommodating the fixed bandwidths allocated by the Federal Communications Commission (FCC), requires increasingly sophisticated signal processing techniques. Since low cost, small size and low power consumption are important in the hardware implementations of such communications systems, custom integrated-circuit solutions are important in achieving these goals.

Next-generation digital television systems such as proposed cable television (CATV) and high-definition television (HDTV) will rely on transceivers to deliver data at rates in excess of thirty megabits per second (30 Mb/s). Quadrature amplitude modulation (QAM) techniques, used in high-speed modems and digital radio systems, represent a promising transmission format for CATV and HDTV systems. In quadrature amplitude modulation (QAM) systems, a pair of amplitude modulated signals having a quadrature (90°) phase relationship to each other are summed to transmit the television signals through the coaxial cable.

There are problems in the use of quadrature amplitude modulation for CATV and HDTV systems. One significant problem is that a considerable amount of noise and distortion is generated in the coaxial cables. Such distortion may result in CATV systems in part from impedance mismatches and reflections from unterminated stubs. In HDTV systems, the distortion may result in part from multi-path reflections. Such distortion is so significant that it impairs a good reception of the television signals.

Until now, analog systems have been proposed to recover the quadrature amplitude modulated data from the analog CATV and HDTV signals in the coaxial cables. Such systems have been disadvantageous because they have not been able to eliminate a significant amount of the noise and distortion in the coaxial cables. Even with their inefficiencies, they have required large amounts of power and considerable space.

This invention recovers the quadrature amplitude modulated data by using digital techniques. The current embodiment of the invention uses only three (3) integrated circuit chips to provide such recovery. The invention recovers the quadrature amplitude modulated data while eliminating substantially all of the noise and distortion in the coaxial cables. The invention also provides for an increased speed of operation, thereby being capable of handling television signals transmitted at increased baud rates. The three (3) integrated circuit chips consume a relatively low amount of power and occupy a relatively small space. Steps are now being taken to provide in a single chip the system now provided in 3 chips. This chip will occupy even less space and consume less power than the three (3) chip system.

In one embodiment of the invention, analog signals encoded with quadrature amplitude modulation (QAM) pass through a coaxial cable at a particular baud rate. The analog signals have a carrier frequency individual to the TV station being received. These signals are mixed with signals from a variable frequency oscillator to produce signals at a particular intermediate frequency (IF). An analog-digital converter (ADC) coverts the intermediate frequency (IF) signals to corresponding digital signals which are demodulated to produce two digital signals having a quadrature phase relationship.

After being filtered and derotated, the two digital signals pass to a symmetrical equalizer including a feed forward equalizer (FFE) and a decision feedback equalizer (DFE) connected to the FFE in a feedback relationship. The DFE may include a slicer providing amplitude approximations of increasing sensitivity at progressive times. Additional slicers in the equalizer combine the FFE and DFE outputs to provide the output data without any of the coaxial cable noise or distortions.

The equalizer outputs and initially the derotation outputs, and the slicer outputs, servo (1) the oscillator to obtain the IF frequency, (2) the ADC sampling clock to obtain the digital conversion at a rate having a particular relationship to the particular baud rate and (3) the derotator. The servos may have (1) first constants initially after the selected TV channel is changed and (2) second time constants thereafter. The ADC gain is also servoed (1) initially in every ADC conversion and (2) subsequently in every nth ADC conversion where n=integer>1. The above recover the QAM data without any of the noise or distortion in the coaxial cable.

IN THE DRAWINGS

FIG. 1 is a diagram schematically illustrating a system for transmitting analog television signals (video and audio) from a selected one of a number of channels or stations through a coaxial cable for reception by a subscriber, the analog signals having been encoded using quadrature amplitude modulation;

FIGS. 2A and 2B collectively constitute a circuit diagram, primarily in block form, of a system constituting one embodiment of the invention for recovering the quadrature amplitude modulated signals from the noise and distortion in the coaxial cable;

FIG. 4 is a simplified schematic diagram illustrating how the derotator and equalizer included in the embodiment of FIGS. 2A and 2B produce an undistorted quadrature amplitude modulation constellation corresponding to the quadrature amplitude modulation signal generated by the transmitting station;

FIG. 7 is a schematic diagram illustrating how certain closed loop servos included in the embodiment of FIGS. 2A and 2B operate when the equalizer chip shown in FIG. 2 provides a QAM constellation with a phase rotation displaced from the QAM constellation transmitted through the coaxial cable by the selected station;

Figure 2A:
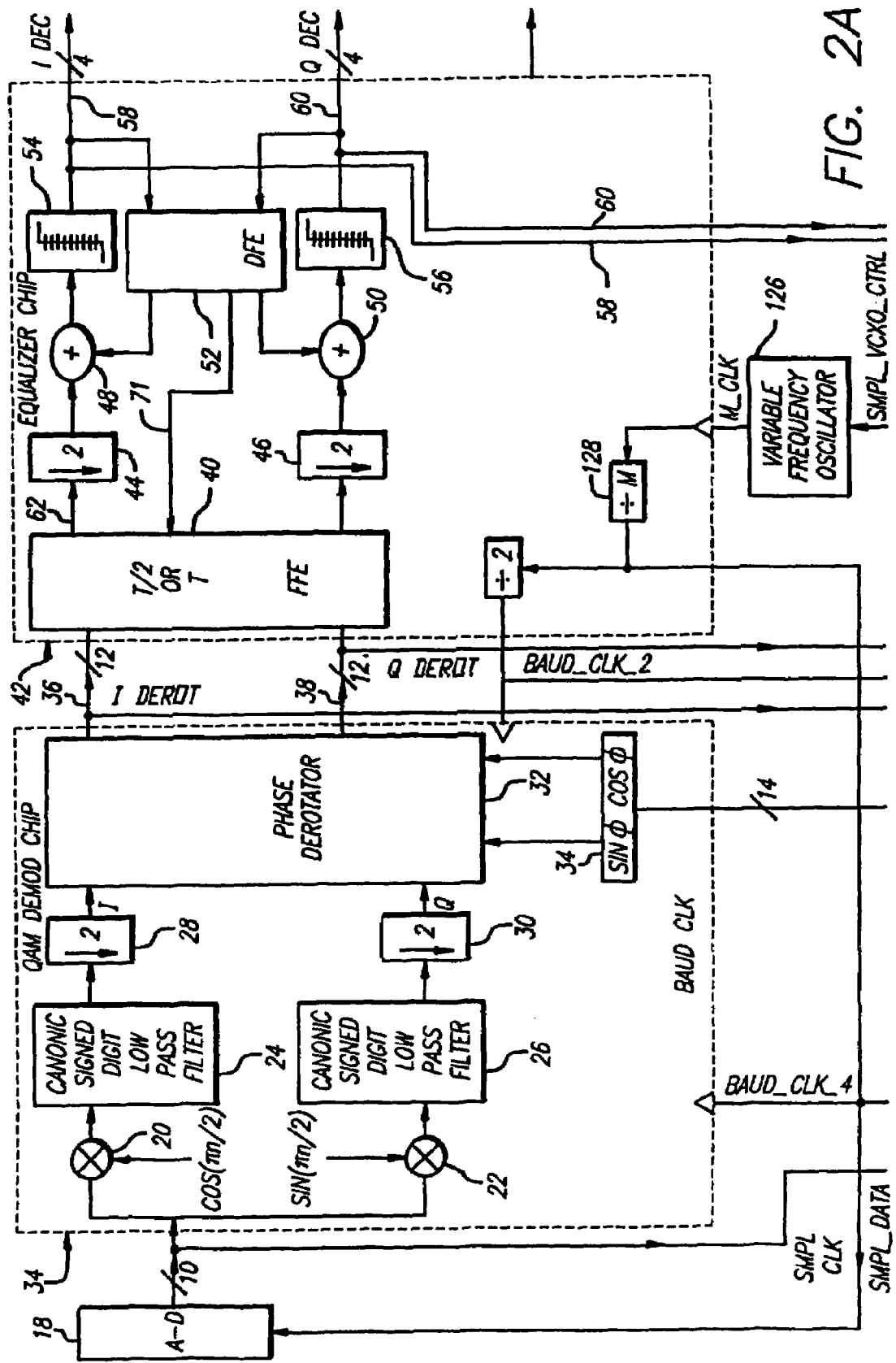
Figure 2B:
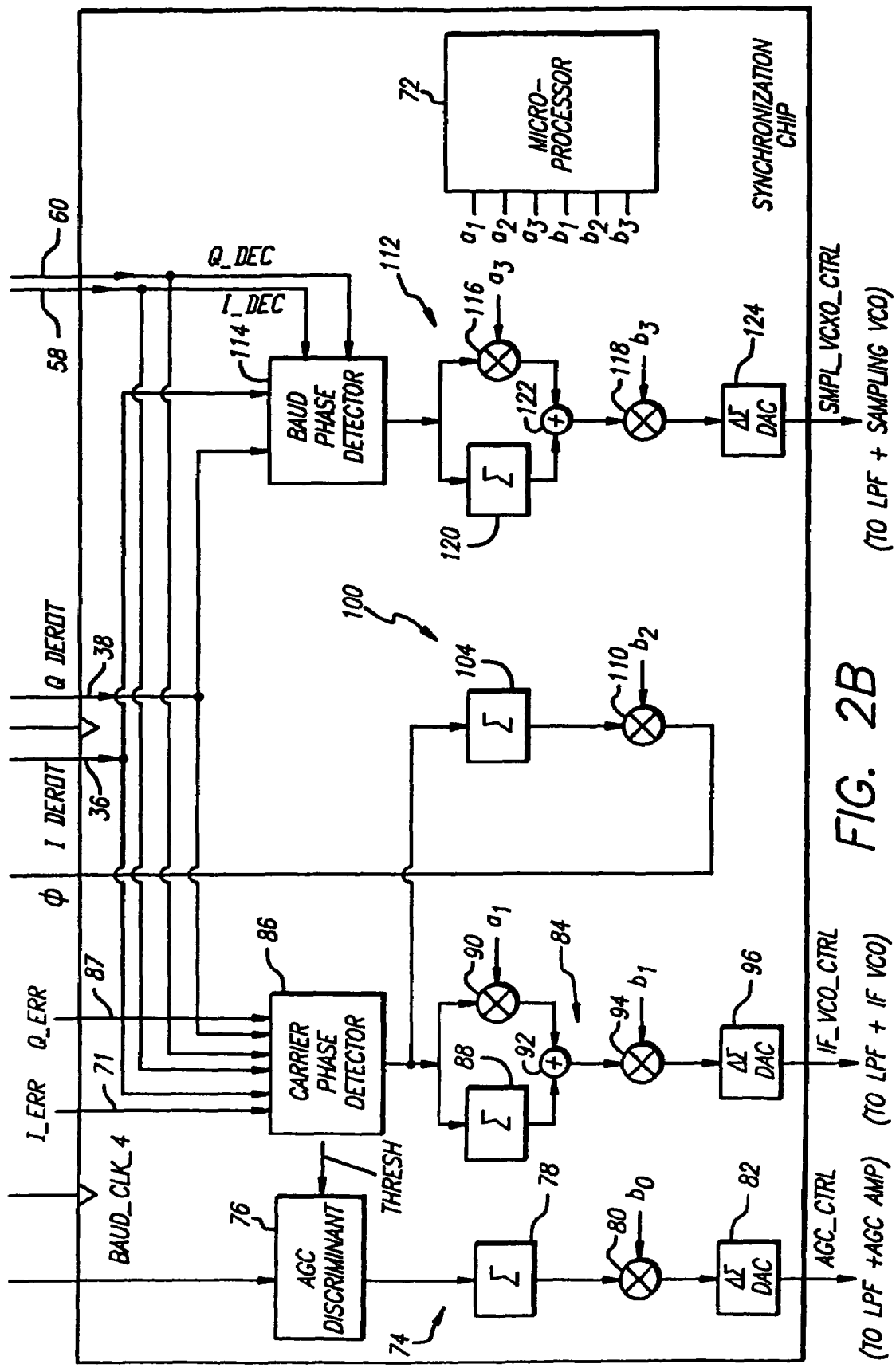
Figure 8:
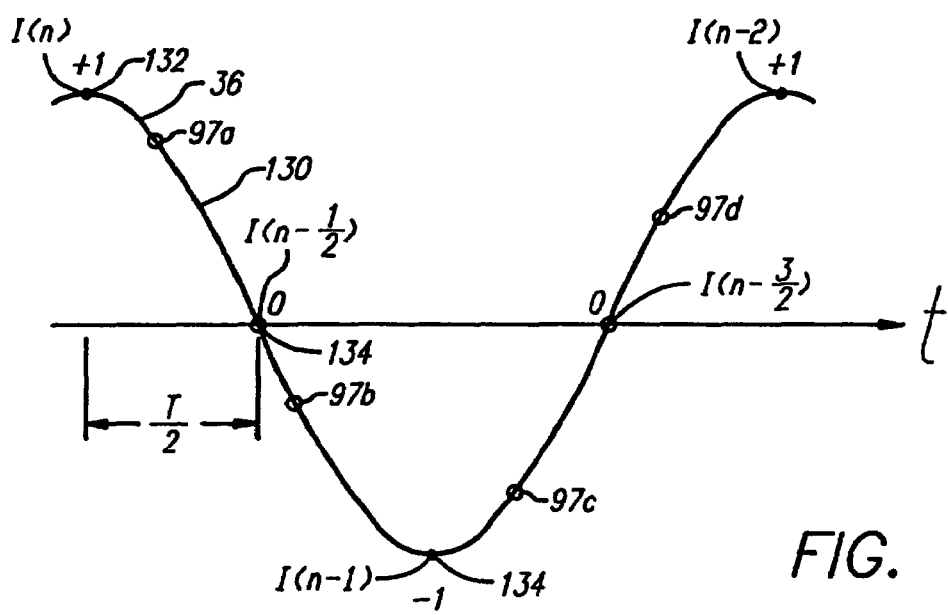
Figure 9:
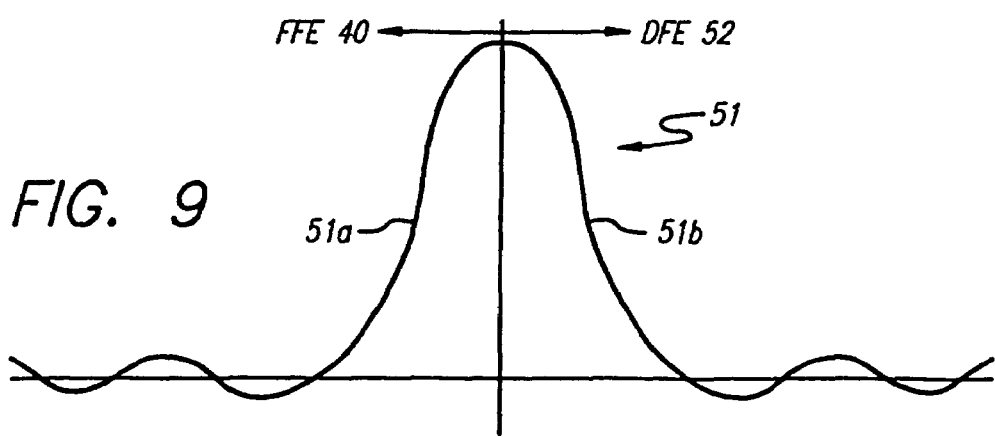

FIG. 8 is a curve further illustrating how the closed loop servos included in the embodiment of FIGS. 2A and 2B operate when the equalizer chip shown in FIG. 2A provides a QAM waveform with a sampling phase displaced from the ideal sampling phase generated by the transmitting station; and FIG. 9 illustrates how filters included in the equalizer chip shown in FIG. 2 produce different parts of the composite QAM signal which is free of the distortion in the coaxial cable.

In one embodiment of the invention, a plurality of television stations or channels 10 (FIG. 1) are provided to transmit television signals (video and audio) through a coaxial cable 12 to a receiver (not shown). Each of the television channels 10 provides a carrier signal at a frequency individual to such channel. The carrier frequency for the lowest one of the stations or channels 10 may be approximately thirty (30) megahertz (30 MHz) and the carrier frequency for the highest one of the stations or channels may have a value of approximately seven hundred and fifty megahertz (750 MHz). The separation in frequency between adjacent pairs of channels may be approximately six megahertz (6 MHz).

The television signals (video and audio) are digitally compressed and encoded and transmitted through the coaxial cable 12 using quadrature amplitude modulation. The television signals modulated as described above are transmitted through the coaxial cable 12 at a particular baud rate. The signals may be compressed by an amount depending upon the baud rate.

A system as described above is well known in the art. Such a system is being proposed to transmit cable television (CATV) signals and is proposed for use to transmit high definition television signals (HDTV) through a coaxial cable such as the cable 12.

As the modulated television signals are transmitted through the coaxial cable 12, noise and distortion develop in the coaxial cable. The distortion may develop from a number of factors. For example, the distortion may develop in cable television systems from impedance mismatches and reflections from unterminated stubs. In high definition broadcast television signals, the distortion may result from multi-path reflections. The distortion in the coaxial cable 12 is so significant that it may prevent the QAM signal from being recovered. The QAM signal has to be recovered in order for the television signals (audio and video) to be processed in the set-top box.

This invention provides a system for, and method of, processing the analog signals in the coaxial cable 12 for any selected one of the individual channels 10 to recover the quadrature amplitude modulated data for such channel from the noise and distortion in the coaxial cable. When the quadrature amplitude modulated data has been recovered by the system of this invention, the television signals (video and audio) for the selected channel 10 can be processed by known techniques to obtain the image and the sound being transmitted in that channel.

The analog signals in the coaxial cable 12 are introduced to a mixer/filter 16 and an oscillator 14 having a variable frequency. The oscillator 14 may preferably be a voltage controlled oscillator whose frequency is varied in accordance with variations in the voltage introduced to the oscillator. As will be described subsequently, the voltage introduced to the oscillator 14 is varied to have the frequency of the oscillator be separated by an intermediate frequency (IF) such as five megahertz (5 MHz) from the individual one of the channels or stations 12 selected at any instant. These signals are mixed in a mixer/filter 16 with the carrier signals in the coaxial cable 12 to produce the intermediate frequency (IF) signal of five megahertz (5 MHz).

Figure 3:
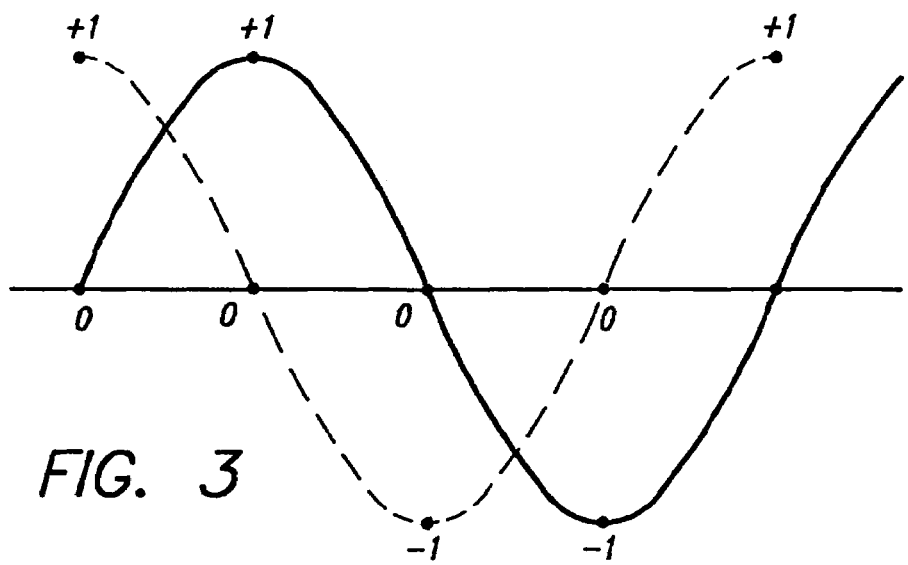
FIG. 3 is a schematic diagram illustrating how a cosine signal is generated in one of the stages of FIG. 2 on a digital basis.

The IF analog signals are then introduced to an analog-to-digital converter 18 (FIGS. 1 and 2A). As will be seen subsequently, the converter 18 operates on the analog signals at four (4) times the baud rate of the selected one of the channels 10 and converts the analog signals to digital signals at this baud rate. The digital signals are then introduced to a pair of multipliers 20 and 22 in FIG. 2A. The multiplier 20 multiplies the digital signals by a cosine function and the multiplier 22 multiplies the digital signals by a sine function. The multiplication by the cosine function occurs from a phase standpoint at progressive 90° intervals. Thus the multiplication occurs with successive digital values of $+1,0,-1,0,+1,0,-1,0$, etc. In like manner, the multiplication of the digital signals by the sine function occurs at 90° intervals as by successive digital values of $0,+1,0,-1,0,+1,0,-1$, etc. The sine and cosine functions formulated as specified above are shown in FIG. 3. The sine function is shown in a solid line and the cosine function is shown in broken lines.

Since the multiplication by each of the sine and cosine functions occurs at four times the baud rate, each of the multipliers 20 and 22 produces signals at a frequency four (4) times the baud rate. The signals from the multipliers 20 and 22 are respectively introduced to canonic signed digit low pass filters 24 and 26. Such low pass filters are well known in the art. For example, they are disclosed in an article entitled "A 200 MHz, All-Digital QAM Modulator and Demodulator in 1.2-um CMOS for Digital Radio Applications" written by Bennett C. Wong and Henry Samueli and published in the EEE Journal of Solid-State Circuits in December 1991. One advantage of such a low pass filter is that it employs a series of adders rather than multipliers as in other filters. Adders are distinctly advantageous over multipliers because they are considerably less complicated in construction and operation than multipliers. This provides for simplicity in the construction and operation of the low pass filters and for a minimal dissipation of power in the filters.

The frequency of the signals from the low pass filters 24 and 26 is divided by two (2) in a pair of stages 28 and 30. The dividers 28 and 30 are disclosed in the article specified in the previous paragraph. After such division, the frequency of the digital signals is still two (2) times the baud rate of the quadrature amplitude modulated data in the coaxial cable 12. The signals from the dividers 28 and 30 are then introduced to a phase derotator 32. The phase derotator 32 is considered to be one (1) of the novel features of this invention. The phase derotator 32 multiplies the baseband digital signals from the dividers 28 and 30 by the trigonometric functions sin Ø and cos Ø. These trigonometric functions have a sampling frequency corresponding to that of the digital signals from the dividers 28 and 30. The functions cosine Ø and sine Ø are supplied by a stage 34.

If the output from the divider 28 is considered as I and the output from the divider 30 is considered as Q, the multiplications provided in the derotator 32 may be indicated as I cos Ø
Q sin Ø
I sin Ø
Q cos Ø

The multiplicands listed above may be combined in pairs as
I cos Ø-Q sin Ø and
I sin Ø-Q cos Ø to produce outputs on lines 36 and 38 of the phase derotator.

If the phases of the pairs of the signals I cos Ø-Q sin Ø and I sin Ø-Q cos Ø do not match the phases of the transmitted QAM constellation, there will be a rotation of the signals. This may be seen from FIG. 4 where four (4) columns and four (4) rows are shown and where Q is shown on the horizontal axis and I is shown on the vertical axis. When the phases of I and Q are properly aligned, the QAM constellation will have the relationship shown in FIG. 4. In this relationship, the I values have a perpendicular relationship and are stationary and the Q values have a horizontal relationship and are stationary. If the phases of I and Q are not properly aligned with the transmitted QAM constellation, the I and Q constellation will spin at a rate dependent upon the differences in phase between the I and Q constellation on the one hand and the transmitted QAM constellation in the coaxial cable 12 on the other hand.

The stages 20, 22, 24, 26, 28, 30 and 32 have been included in an integrated circuit chip generally indicated at 34 in FIG. 2A. This chip is designated in FIG. 2A as QAM DEMOD CHIP and is shown in broken lines. The signals from the phase derotator 32 in the integrated circuit chip 34 pass through the lines 36 and 38 to a feed forward equalizer (FFE) 40 in an integrated circuit chip generally indicated at 42. The chip 42 is designated in FIG. 2 as an "EQUALIZER CHIP" and is shown in broken lines. A suitable feed forward equalizer 40 is disclosed in an article entitled "A 100 MHz, 5 MBaud Decision Feedback Equalizer for Digital Television Applications" written by Robindra B. Joshi and Henry Samueli and published in the IEEE International Solid-States Circuits Conference on Feb. 16, 1994. The feed forward equalizer 40 may perform either a T-spaced function or a T/2-spaced function.

The rate of occurrence of the outputs from the feed forward equalizer 40 is divided in the chip 42 by a pair of stages 44 and 46. Each of these divisions is by a factor of two (2). This causes the digital signals from the dividers 44 and 46 to have the baud rate of the analog signals introduced to the converter 18. The signals from the dividers 44 and 46 are respectively introduced to adders 48 and 50 as are outputs from a decision feedback equalizer 52. The adders 48 and 50 and the decision feedback equalizer 52 are included in the equalizer chip 42. The decision feedback equalizer 52 and the combination of the stages in the equalizer chip 42 are considered to be new to this invention.

The adder 48 adds the outputs of the feed forward equalizer 40 and the decision feedback equalizer 52 to provide an output which is introduced to a slicer 54. This addition may be seen from FIG. 9. As will be seen, a composite signal generally indicated at 51 is shown as being comprised respectively of left and right halves 51a and 51b. The feed forward equalizer 40 may be considered to correct for distortions in the left half 51a of the composite signal 51 and the decision feedback equalizer 52 may be considered to correct for distortions in the right half 51b of the composite signal 51. The adder 48 accordingly provides the binary value of the composite signal 51.

The outputs from the adders 48 and 50 are shown in FIG. 2A as being respectively introduced to a pair of slicers 54 and 56. Slicers such as the slicers 54 and 56 are considered to be known in the art. Each of the slicers 54 and 56 operates to provide a plurality (such as eight (8)) of progressive values and to determine the particular one of the eight (8) values closest to the output of the associated adder. For example, the slicer 54 selects a particular one of the eight (8) values closest to the output of the adder 48 and then provides this output on a line 58. Similarly, the slicer 56 selects a particular one of the eight (8) values closest to the output of the adder 50 and then provides this output on a line 60. The slicers 54 and 56 are included in the integrated circuit chip 42.

As will be seen in FIG. 2A, the stages on the integrated circuit chip 42 are symmetrical with respect to the I and Q channels. The symmetry is provided because of the symmetrical relationship of the stages 44, 48 and 54 between the equalizers 40 and 52 and the stages 46, 50 and 56 between the equalizers. The symmetrical relationship of the stages in the integrated circuit chip 42 facilitates an optimal detection of the quadrature amplitude modulated signals on the lines 58 and 60 with much less complexity than an asymmetrical structure. The symmetrical structure is practical when the analog-digital converter 18 operates on the IF signal. When the analog-digital converter operates on the baseband I and Q signals, an asymmetrical structure is required. This increases the complexity of the hardware.

Figure 5:
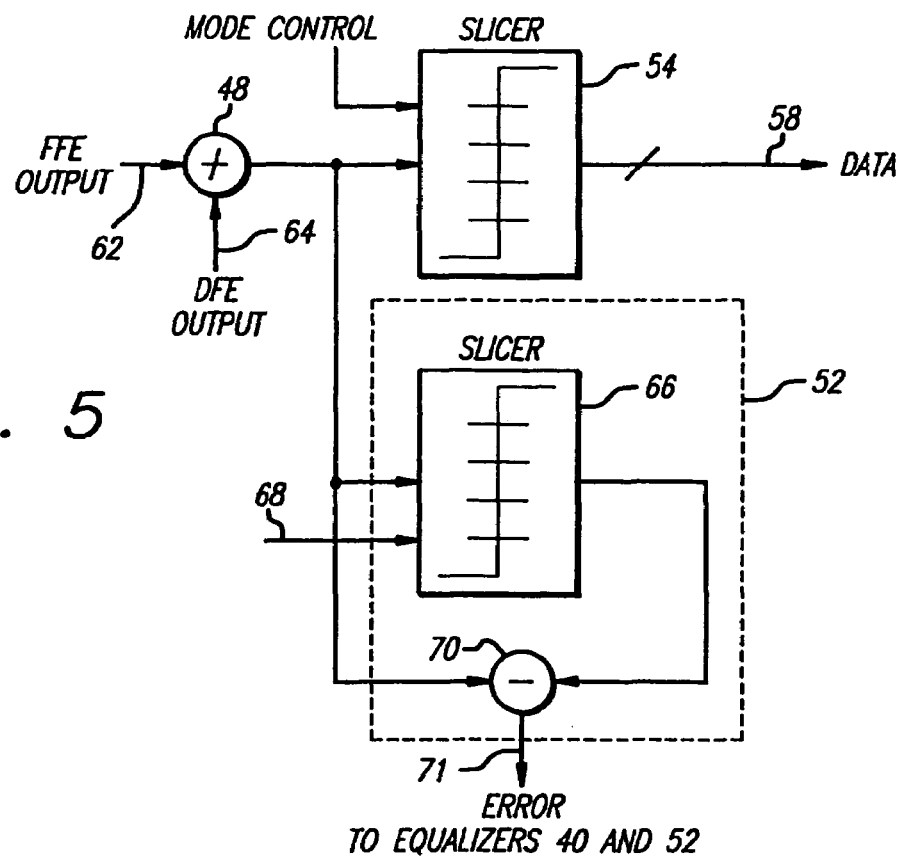
FIG. 5 is a circuit diagram, primarily in block form, illustrating in additional detail data and error slicer stages in an equalizer chip shown in FIG. 2A.

FIG. 5 illustrates certain of the stages in FIG. 2A in additional detail. FIG. 5 shows the adder 48 and the slicer 54 also shown in FIG. 2A. FIG. 5 also shows the output from the feed forward equalizer 40 on a line 62 and the output from the decision feedback equalizer 52 on a line 64, both of these outputs being introduced to the adder 48. As in FIG. 2A, the output of the adder 48 is shown as being introduced to the slicer 54. The output of the adder 48 is also shown in FIG. 5 as being introduced to the input of a slicer 66 which is included in the decision feedback equalizer 52 shown in broken lines in FIG. 5. The slicer 66 also receives a control input on a line 68. The output of the slicer 66 is introduced to a stage 70 which determines the difference between the output of the slicer 66 and the output of the adder 48. The output of the stage 70 is introduced on a line 71 to both the feed forward equalizer 40 and the decision feedback equalizer 52 also shown in FIG. 2A. This output may be considered to constitute the error feedback from the slicer 66 to the feed forward equalizer 40 and the decision feedback equalizer 52 in FIG. 2A.

The control line 68 receives successive binary indications from a microprocessor 72 (FIG. 2B) of two (2), four (4), eight (8) and sixteen (16) binary values. These respectively represent the square roots of four (4), sixteen (16), sixty four (64) and two hundred and fifty six (256). When the control line 68 in FIG. 5 receives a binary indication of two (2), the slicer 66 selects the binary value from the adder 48 closest to the two (2) progressive binary values in the slicer 66 and substitutes the closest of these two (2) values in the slicer 66 as the output from the slicer 66.

After a fixed period of time preset into the microprocessor 72, the slicer 66 provides four (4) progressive binary values and determines which one of these four (4) progressive binary values is closest to the binary value now provided as the output from the slicer. After an additional fixed period of time preset by the microprocessor 72, the slicer 66 again increases the number of progressive binary values, this time to eight (8). The slicer 66 then determines the individual one of the eight (8) progressive binary values closest to the adjusted input to the slicer 66 and selects this individual one of the progressive binary values as the new adjusted output from the slicer 66. If the receiver is operating in the 256-QAM mode, then, after another fixed period of time preset by the microprocessor 72, the slicer 66 again repeats this procedure, but this time with sixteen (16) progressive values in the slicer 66.

In this way, the slicer 66 initially provides a coarse control and, in subsequent time periods preset by the microprocessor 72, provides controls of progressively increasing sensitivity. These controls of progressively increasing sensitivity are fed by the slicer 66 to the stage 70, which produces the error signal that is fed back to the feed forward equalizer 40 and the decision feedback equalizer 52 to control the operation of coefficient updating loops in the equalizers. Upon each such feedback, the feed forward equalizer 40 and the decision feedback equalizer 52 adjust the values of the binary filter coefficients in the equalizers to provide an output of progressively increasing accuracy from the slicer 54.

Although the discussion above has centered specifically on the adder 48, the slicer 66 and the slicer 54, it will be appreciated that similar operations may be provided for a slicer (corresponding to the slicer 66) associated with the adder 50 and the slicer 56 to provide an output of progressively increasing accuracy from the slicer 56. As a result, the slicers 54 and 56 progressively provide, at successive instants of time, in-phase (I) and quadrature (Q) data estimates which progressively approach the values of the quadrature amplitude modulated data in the coaxial line 12.

In providing at progressive instants of time the outputs discussed in the previous paragraph, the slicer 66 in FIG. 5 provides at progressive instants of time two (2), four (4), eight (8) and sixteen (16) binary levels. The corresponding slicer associated with the adder 50 provides similar numbers of binary levels at progressive instants of time. Since the two (2) slicers respectively represent I and Q, they provide at successive instants of time four (4), sixteen (16), sixty four (64) and two hundred and fifty six (256) possible output pairs. This may be seen from the representation shown in FIG. 4 for the case of sixteen (16) outputs.

There are a number of closed loop servos which enhance the response of the system constituting this invention. One of these is indicated generally at 74 in FIG. 2B. It provides an automatic gain control for the analog signals introduced to the analog-digital converter 18. As will be appreciated, it is desirable to regulate the gain of the analog signals before they are converted to digital signals by the converter 18. One reason is that the amplitude of the analog signals at each instant affects the characteristics of the television information. The automatic gain control (AGC) servo 74 includes an AGC discriminant stage 76, an accumulator stage 78, a multiplier 80 and a digital-to-analog converter 82. The converter 82 may be a delta-sigma converter well known in the art. Although the stages 74, 76, 78, 80 and 82 may be considered to be individually known in the art, they are not known in the environment included in this invention for regulating the gain of the input to the analog-digital converter 18 in this invention.

The AGC discriminant stage 76 initially provides a determination of the digital value (after conversion from analog) at a rate four (4) times the rate of the baud samples. This stage provides a close regulation of the gain in the analog signals. After a fixed time preset by the microprocessor 72, the AGC discriminant stage 76 provides a determination of the digital value (after conversion from analog) in every nth baud sample where n is an integer greater than one (1) and is preset by the microprocessor 72 (FIG. 2B).

The AGC discriminant stage 76 is able to operate in every nth sample because the stage has previously provided a strong (or coarse) regulation by determining and regulating the digital value at a rate four (4) times the rate of the baud samplings. Providing the determination in every nth baud sample after this initial strong (or coarse) regulation is desirable because it minimizes the consumption of power and because the circuitry for providing the determination in every nth baud sample is simpler than the circuitry for providing the determination at a rate four (4) times the rate of the baud samples.

The output from the AGC discriminant stage 76 is introduced to the accumulator 78 which operates to sum and average this output with the previous outputs from the stage 76. The multiplier 80 then multiplies the output from the accumulator 78 by a constant value $b_0$ preset by the microprocessor 72. The constant $b_0$ is initially set by the microprocessor 72 at a first fixed value. This first value for the constant $b_0$ is set so that the servo 74 can provide strong (or coarse) adjustments after the television station or channel 10 desired to be viewed has been changed.

After a fixed period of time preset by the microprocessor 72, the constant $b_0$ is changed by the microprocessor 72 to a second value. This second value of the constant $b_0$ provides for a weaker regulation than the first value of the constant $b_0$. This weaker regulation is quite satisfactory because of the previously strong (or coarse) regulation during the period of the first value of the constant. The output of the multiplier 80 is converted to an analog value by the converter 82. This analog value is used to regulate the gain of the analog signals introduced to the input to the analog-digital converter 18. Another closed loop servo, generally indicated at 84 in FIG. 2B, corrects for the frequency of the variable frequency oscillator 14 (e.g. voltage controlled oscillator) to provide the oscillator with a frequency which differs from the carrier frequency for the selected station 10 by the intermediate frequency of five megahertz (5 MHz). In this way, a constant intermediate frequency can be provided regardless of which one of the stations 10 in the plurality is selected. The servo 84 includes an intermediate frequency (IF) carrier phase detector 86 having inputs respectively connected initially to the two (2) output lines 36 and 38 from the derotator 32 in FIG. 2A. The output lines 36 and 38 are respectively designated as IDEROT and QDEROT in FIG. 2A. Inputs to the intermediate carrier phase detector 86 are also respectively connected to the output lines 58 and 60 from the slicers 54 and 56.

As will be seen, the phase detector 86 has four (4) inputs. Two of these inputs may be considered as decision values and are obtained from the output lines 58 and 60. These decision values may be respectively designated as $\hat{I}$ and $\hat{Q}$. The outputs from the lines 36 and 38 may be respectively designated as I and Q. The four (4) inputs may be combined to obtain the following outputs:

$I\hat{Q}$
$Q\hat{I}$

These two (2) values are subtracted from each other as follows:

$I\hat{Q} - Q\hat{I}$

When there is no phase error in the output signals on the lines 58 and 60 relative to the ideal QAM constellation as shown in FIG. 4, $I\hat{Q} - Q\hat{I} = 0$. When $I\hat{Q} - Q\hat{I}$ is different from zero (0), the magnitude of this difference represents the amount of the phase error in the output signals on the lines 58 and 60 relative to the ideal QAM constellation.

The phase error signal $I\hat{Q} - Q\hat{I}$ may be simplified in hardware by instead computing the following phase error term $\text{sgn}[I \, \text{sgn}(\hat{Q}) - Q \, \text{sgn}(\hat{I})]$ where the designation "sgn" in front of a term indicates whether the term is positive or negative. This simplified phase error term can be computed without the need for multiplications. This greatly simplifies the hardware implementation.

Figure 6:
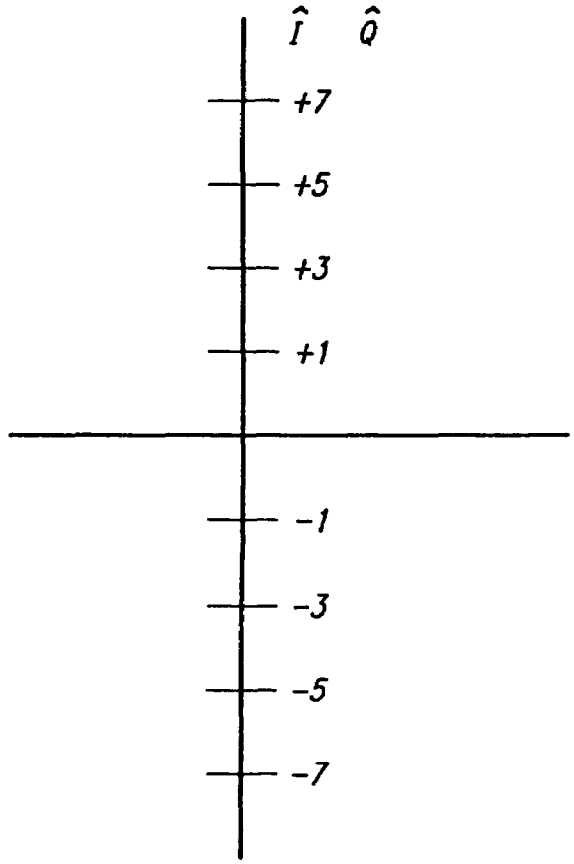
FIG. 6 is a chart further illustrating the possible output values of the slicer when operating in a 64-QAM mode.

As previously described, the decision values $\hat{Q}$ and $\hat{I}$ correspond to an individual one of a0 number of binary values. For example, FIG. 6 indicates four (4) binary values between zero (0) and plus seven (+7) and four (4) binary values between zero and minus seven (−7). One of these binary values is indicated at 89 in FIG. 7 for the case of 4-QAM. If there is a phase error between the outputs on the lines 58 and 60 and the ideal QAM constellation represented by the circles in FIG. 7, the I and Q outputs of the phase derotator 32 may be shifted to a position 91 in FIG. 7. As will be seen, this shift to the position 91 causes I to have an error indicated at 93 in FIG. 7 and Q to have an error indicated at 95 in FIG. 7. The phase detector 86 detects the difference 93 in the position between I and Î along the vertical axis and the difference 95 in the position Q and Q̂ along the horizontal axis computes the phase error denoted by γ in FIG. 7.

The above phase detector technique is used in conjunction with a sweep circuit to obtain an initial coarse acquisition of the QAM signal. The sweep circuit is implemented under the control of the microprocessor 72 which provides a small positive or negative offset value at the input of an accumulator 88 in FIG. 2B. This offset causes the accumulator output to either ramp up or down depending on whether the offset was positive or negative. A digital-analog converter 96 converts these binary numbers to a ramping voltage which controls the variable frequency oscillator 14. This enables the oscillator 14 to sweep through a range of frequencies and thus match up exactly with the carrier frequency of the incoming QAM signal.

After a fixed period of time preset by the microprocessor 72, the phase detector technique is changed to provide a more precise, fine resolution, phase tracking capability. The fine resolution phase tracking algorithm is computed as $$e_I \hat{Q} - e_Q \hat{I}$$

where $e_I$ is the I channel slicer error on the line 71, and $e_Q$ is the channel slicer error 56 on a line corresponding to the line 71. The phase error computation specified in the equation immediately above is similar to the coarse acquisition technique except that I and Q have been respectively replaced by $e_I$ and $e_Q$. The fine resolution phase error signal $e_I \hat{Q} - e_Q \hat{I}$ may be simplified in hardware by instead computing the following phase error term $$e_I \, \mathrm{sgn}(\hat{Q}) - e_Q \, \mathrm{sgn}(\hat{I})$$

This simplified phase error term can be computed without the need for multiplications. This greatly simplifies the hardware implementation. In these equation, the designation "Sgn" in front of a term indicates whether the term is positive or negative.

The output from the detector 86 is introduced to a pair of stages connected in parallel in FIG. 2B. One of these stages constitutes the accumulator 88 and the other stage constitutes a multiplier 90. The multiplier 90 is multiplied by a constant $a_1$ which is preset by the microprocessor 72. The multiplier 90 in effect damps the output of the accumulator 88 by a factor dependent upon the value of the constant $a_1$. The accumulator 88 and the multiplier 90 provide outputs which are combined in an adder 92. The output from the adder 92 is introduced to a multiplier 94 which multiplies this output by a constant $b_1$ preset by the microprocessor 72. The output of the multiplier 94 is introduced to a digital-analog converter 96 which is well known in the art. For example, the converter 96 may be a delta-sigma type of converter. Stages such as the stages 88, 90, 92, 94 and 96 may be individually well known in the art but not in the environment shown in FIGS. 2A and 2B.

The servo 84 is shown as having two constants $a_1$ and $b_1$. Actually, each of these constants may have two (2) values. One of these values for each of the constants $a_1$ and $b_1$ may be provided by the microprocessor 72 for a fixed period of time after a change in the selection of the station or channel 10 to be viewed. In effect, these first values provide a coarse control over the frequency of the oscillator 14. After a fixed period of time preset by the microprocessor 72, each of the constants $a_1$ and $b_1$ is changed to a second value. In effect, this provides a fine control over the selection of the frequency in the oscillator 14. It will be appreciated that each of the first and second values of the constant $a_1$ may be different from each other and from the first and second values of the constants $b_0$ and $b_1$. This is also true of the other constants which will be discussed subsequently.

The digital signals on the output lines 36 and 38 and on the output lines 58 and 60 are initially introduced to the phase detector 86 to provide a strong, but coarse, control over the phases of the signals cos ø and sin ø. This control is particularly strong (or coarse) since the output of the derotator 32 is used to regulate the input to the derotator. After a fixed period of time preset by the microprocessor 72, the phase detector 86 receives the error output 71, and the slicer error output on the line associated with the slicer 56 and corresponding to the line 71 and also receives the outputs on the lines 58 and 60. This provides a fine resolution phase control because, after equalizer convergence, the slicer error on the line 71 and the slicer error on the line corresponding to the slicer 71 are very precise.

The output of the detector 86 is also introduced to a filter stage consisting of an accumulator 104 and a multiplier 110. The output of the multiplier 110 is a filtered phase error term Ø which is applied to the phase derotator blocks 32 and 34 to decrease the difference in phase between the signals from the derotator 32 and the QAM constellation.

The stage 110 multiplies the output from the accumulator 104 by a constant $b_2$. The constant $b_2$ has a first value preset by the microprocessor 72. After a fixed period of time preset by the microprocessor 72, the constant $b_2$ has another value. These different values are provided so that the servo 86 will be initially able to adapt on a coarse basis to a change in the station or channel 10 selected and the servo 100 will subsequently be able to operate on a fine basis to regulate the phases of the signals cos ø and sin ø.

Furthermore, the I Derot and Q Derot signals respectively on the lines 36 and 38 initially provide a coarse control in the operation of the servos 84 and 100 when combined with the signals on the lines 58 and 60. Subsequently, the I error signals on the line 71 from the slicer 66 and the corresponding error signals on the line corresponding to the line 71 from the slicer corresponding to the slicer 66 provide a fine control in the operation of the servos 84 and 100 when combined with the signals on the lines 58 and 60.

The overall carrier tracking servo loop thus consists of two servos operating in parallel. The first servo 84 is a relatively slow reacting loop since it feeds all the way back to the variable frequency oscillator 14. The second servo 100 is a fast reacting loop which can track very rapid fluctuations in the phase of the incoming QAM signal. Each of these servos is considered to be an important feature of the invention. The combination of these servos in the manner described above is also considered to be an important feature of this invention.

Another closed loop servo generally indicated at 112 in FIG. 2B regulates the rate at which the analog-digital converter 18 converts the analog signals in the coaxial cable 12 to digital signals. This rate is regulated so that the digital conversion will occur at four (4) times the baud rate of the analog signals in the coaxial cable 12. The servo 112 includes the same stages as the servo 84. For example, a baud phase detector 114 receives the digital signals on the lines 36 and 38 and the lines 58 and 60 and computes a sampling phase error which is filtered as at 116, 118, 120 and 122 is converted from digital to analog as at 124 and is applied to a variable frequency oscillator 126 (FIG. 2A) which generates a master clock M-CLK as at 128 for the system. The two multipliers 116 and 118 in the servo 112 respectively receive constants $a_3$ and $b_3$ from the microprocessor 72. Each of these constants $a_3$ and $b_3$ initially has a first value and subsequently has a second value as described previously for other constants.

The operation of the baud phase detector 114 can be described by referencing FIG. 8. FIG. 8 illustrates an example of an I channel waveform 130 with a trajectory that traverses from +1 to −1 and back to +1, thereby crossing zero twice. The Q channel waveform (not shown in FIG. 8) has a trajectory similar to that of the I channel waveform 130 shown in FIG. 8. The frequency of occurrence of the derotator output samples on the lines 36 and 38 is twice the baud rate. Thus, the time interval between samples is T/2 as shown in FIG. 8 where T is the reciprocal of the baud rate.

If the analog-digital converter 18 is sampling the received QAM signal perfectly, then the derotator output samples will be +1,0,−1,0,+1 as shown in FIG. 8. On the other hand, if, for example, the analog-digital converter 18 is sampling too late, then the derotator output samples will be 97a, 97b, 97c, and 97d. The baud phase detector 114 initially determines if a zero crossing has occurred, i.e., it checks to determine if sgn[$\hat{I}(n)$]≠sgn [$\hat{I}(n-1)$] where $\hat{I}(n)$ and $\hat{I}(n-1)$ are two consecutive slicer data decisions 132 and 134 in FIG. 8. If a zero crossing has occurred, then the baud phase error is sgn [$\hat{I}(n)$] sgn [I(n−½)] where I(n−½) is indicated at 136 in FIG. 8.

A similar computation is performed on the Q channel derotator output, i.e., if a Q channel zero crossing has occurred, then the Q channel baud phase error is sgn [$\hat{Q}(n)$]sgn[Q(n−½)]

The baud phase detector output can either be the I channel baud phase error, the Q channel baud phase error or the sum of the two:

sgn[$\hat{I}(n)$]sgn[I(n−½)]+sgn [$\hat{Q}(n)$]sgn[Q(n−½)]

In the preferred embodiment, the baud phase detector output is chosen as the sum of the I channel and Q channel phase errors.

In FIG. 2A, the variable frequency oscillator 126 provides a master clock signal. This signal has a suitable frequency such as approximately eighty (80) megahertz. This is higher than the baud rate. From this master clock, frequencies constituting (a) four (4) times the baud rate, (b) two (2) times the baud rate and (c) the baud rate are generated. These are designated in FIGS. 2A and 2B as "BAUD CLK 4", "BAUD CLK 2" and "BAUD CLK".

The system and method described above have certain important advantages. They can optimally detect the quadrature amplitude modulated data transmitted over the coaxial cable 12 with very low complexity. The system and method of this invention detect such quadrature amplitude modulated data in the lines 58 and 60 without being affected by any of the distortions in the coaxial cable 12. The detected data in the lines 58 and 60 can then be processed in a manner well known in the art to recover the television signals (video and audio). The recovered television signals are then processed to provide a television image and the accompanying sound.

The system and method of this invention employ techniques which have not previously been employed in systems and methods involving quadrature amplitude modulation and which provide for results significantly advanced in relation to the prior art. For example, the system and method of this invention employ digital signal processing techniques to provide on the lines 58 and 60 optimally detected QAM data which eliminate substantially all of the distortions in the coaxial cable. The system and method of this invention include the derotator 32 to improve the phase tracking capabilities in spite of the noise and distortion and include the symmetrical relationship of the stages in the equalizer chip 42 to significantly reduce hardware complexity. The system and method of this invention are also advantageous in employing the slicers 54 and 66 and in employing the slicer 56 and a slicer corresponding to the slicer 66 in providing this robust symmetric equalization. The system and method of this invention are further advantageous in providing the decision feedback equalizer 52 and the feed forward equalizer 40 to optimally correct for the distortion in the coaxial cable 12.

Servos are included in the system and method of this invention. These servos are believed to be broadly new and patentable in providing on the lines 58 and 60 QAM data which are substantially free of noise and distortion and which are provided with very accurate baud and carrier phases corresponding to the phases of the transmitted QAM signals in the coaxial cable 12. An individual one of the servos regulates the frequency of the signals from the oscillator 14 to obtain the intermediate frequency of five megahertz (5 MHz). Another one of the servos regulates the gain of the analog signals introduced in the coaxial cable 12 to the converter 18. A third one of the servos regulates the conversion of these analog signals to digital signals at four (4) times the baud rate. A fourth one of the servos regulates the phase and frequency of the cosine ø and sine ø signals introduced to the stage 34 so that the phase of the digital signals from the derotator 32 will correspond to the phase of the QAM signals in the coaxial cable 12.

The servos described in the previous paragraph have sophistications which further enhance their operation in providing on the output lines 58 and 60 quadrature amplitude demodulated signals free of the noise and distortions in the coaxial cable 12 and corresponding in baud and carrier phase to the phases of the quadrature amplitude modulated signals in the coaxial cable. One of these sophistications for three (3) of the four (4) servos is initially to use the signals on the lines 36 and 38 for regulation and subsequently to use the signals representing the slicer errors on the line 71 and the slicer error on the line corresponding to the line 71 for such regulation.

Another sophistication is the use of two parallel servos for carrier acquisition and tracking. One slow reacting servo controls the IF variable frequency oscillator to track the incoming frequency. The second fast reacting servo controls the phase derotator to track any phase variations on the incoming signal. Both effectively provide controls of frequency, one providing a coarse control and the other providing a fine control.

Another sophistication is to provide individual time constants in the different servos and to provide each of these time constants with a first value for a first period of time after a change in the individual one of the channels 10 selected and then with a second value after the first period of time. All of the sophistications specified in this paragraph and in the previous paragraphs cause each of the servos initially to provide a coarse control and subsequently to provide a fine control.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. A system to recover in phase and quadrature phase data from a quadrature amplitude modulated (QAM) signal, comprising:

an analog to digital converter (ADC) configured to sample the QAM signal to produce a digital signal;

a first multiplier configured to multiply the digital signal by a first mathematical function to provide an in phase (I) signal;

a second multiplier configured to multiply the digital signal by a second mathematical function to provide a quadrature phase (Q) signal; and an equalizer configured to correct for distortions in the I signal and the Q signal to provide the in phase data and the quadrature phase data, wherein the equalizer comprises:

a feed forward equalizer (FFE) configured to correct for distortions in a left half of the I signal and in a left half of the Q signal, and a decision feedback equalizer (DFE) configured to correct for distortions in a right half of the I signal and in a right half of the Q signal, and a slicer configured to provide the in phase data and the quadrature phase data based upon an output of the FFE and the DFE.

2. The system of claim 1, further comprising:
a mixer/filter configured to downconvert the QAM signal.

3. The system of claim 2, wherein the mixer/filter is further configured to receive the QAM signal from a coaxial cable.

4. The system of claim 1, wherein at least one of: the first mathematical function and the second mathematical function includes at least one of:
a cosine function; and
a sine function.

5. The system of claim 1, wherein multiplication by the first mathematical function and the second mathematical function occurs at 90° intervals.

6. The system of claim 1, further comprising:
a first canonic signed digit low pass filter to filter an output of the first multiplier; and
a second canonic signed digit low pass filter to filter an output of the second multiplier.

7. The system of claim 1, further comprising:
an adder configured to provide an input to the slicer based upon an output of the FFE and the DFE,
wherein the slicer determines a corresponding one of a plurality of progressive values that is substantially closest to an output of the adder.

8. A method to recover in phase and quadrature phase data from a quadrature amplitude modulated (QAM), comprising:
(A) sampling the QAM signal to produce a digital signal;
(B) multiplying the digital signal by a first mathematical function to provide an in phase (I) signal;
(C) multiplying the digital signal by a second mathematical function to provide a quadrature phase (Q) signal;
(D) correcting for distortions in the I signal and the Q signal to provide the in phase data and the quadrature phase data, wherein step (D) comprises:
(D)(i) correcting for distortions in a left half of the I signal and in a left half of the Q signal,
(D)(ii) correcting for distortions in a right half of the I signal and in a right half of the Q signal, and
(D)(iii) producing the in phase data and the quadrature phase data based upon step (D)(i) and (D)(ii).

9. The method of claim 8, further comprising prior to step (A):
(1) downconverting the QAM signal.

10. The method of claim 9, wherein step (1) comprises:
(1)(i) receiving the QAM signal from a coaxial cable.

11. The method of claim 8, step (B) comprises:
(B)(i) multiplying the digital signal by at least one of:
a cosine function; and
a sine function.

12. The method of claim 8, further comprising after step (B):
(1) filtering the I signal.

13. The method of claim 8, wherein step (D)(iii) comprises:
(D)(iii)(a) combining an output of step (D)(i) and (D)(ii); and
(D)(iii)(b) determining a corresponding one of a plurality of progressive values that is substantially closest to an output of step (D)(iii)(a).

14. The method of claim 8, wherein step (C) comprises:
(C)(i) multiplying the digital signal by at least one of:
a cosine function; and
a sine function.

15. The method of claim 8, further comprising after step (C):
(1) filtering the Q signal.

* * * * *

UNITED STATES PATENT AND TRADEMARK OFFICE
CERTIFICATE OF CORRECTION

PATENT NO.       : 7,515,630 B2                                               Page 1 of 1
APPLICATION NO. : 11/364518
DATED            : April 7, 2009
INVENTOR(S)      : Samueli et al.

It is certified that error appears in the above-identified patent and that said Letters Patent is hereby corrected as shown below:

At column 14, line 22, "The method of claim 8, step (B)" should be replaced by --The method of claim 8, wherein step (B)--.

Signed and Sealed this

Fourteenth Day of July, 2009

JOHN DOLL
*Acting Director of the United States Patent and Trademark Office*